(12) United States Patent
Lee et al.

(10) Patent No.: US 11,204,661 B1
(45) Date of Patent: Dec. 21, 2021

(54) METHOD OF GENERATING OPERATION SIGNAL OF ELECTRONIC DEVICE, AND ELECTRONIC DEVICE

(71) Applicant: SAMSUNG ELECTRO-MECHANICS CO., LTD., Suwon-si (KR)

(72) Inventors: Gye Won Lee, Suwon-si (KR); Jong Yun Kim, Suwon-si (KR); Mun Sun Jung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/060,517

(22) Filed: Oct. 1, 2020

(30) Foreign Application Priority Data

Jul. 7, 2020 (KR) .......................... 10-2020-0083285

(51) Int. Cl.
*G06F 3/041* (2006.01)
*H03K 17/96* (2006.01)
*G06F 3/046* (2006.01)

(52) U.S. Cl.
CPC .......... *G06F 3/04144* (2019.05); *G06F 3/046* (2013.01); *H03K 17/96* (2013.01)

(58) Field of Classification Search
CPC ................ G06F 3/04144; G06F 3/046; G06F 2203/04105; G06F 3/04142; G06F 3/0414; H03K 17/96
See application file for complete search history.

(56) References Cited

U.S. PATENT DOCUMENTS

| 10,485,094 B1 * | 11/2019 | Isohatala ................ G06F 3/0445 |
| 2003/0210235 A1 * | 11/2003 | Roberts .................. G06F 3/0414 |
| | | 345/173 |

(Continued)

FOREIGN PATENT DOCUMENTS

| JP | 2015-32276 A | 2/2015 |
| JP | 2016-29550 A | 3/2016 |

(Continued)

OTHER PUBLICATIONS

Korean Notice of Reason for Rejection dated Oct. 27, 2021 in corresponding Korean Patent Application No. 10-2020-0083285. (8 pages in English and 6 pages in Korean).

*Primary Examiner* — Ibrahim A Khan
(74) *Attorney, Agent, or Firm* — NSIP Law

(57) ABSTRACT

A method of generating an operating signal of an electronic device includes: deriving a force measurement value based on a change in inductance of a touch sensing device disposed inside a housing of the electronic device and configured to change inductance by external pressure applied to a touch switching unit of the housing; accumulatively recording the force measurement value derived in the deriving of the force measurement value; setting a reference value based on the recorded force measurement value, in response to the force measurement value being accumulatively recorded until a unit condition is satisfied; and generating an operating signal based on a high and low relationship between the force measurement value derived from the change in inductance occurring after the setting of the reference value, and the set reference value.

24 Claims, 14 Drawing Sheets

(56) References Cited

U.S. PATENT DOCUMENTS

| | | | | |
|---|---|---|---|---|
| 2007/0113681 | A1* | 5/2007 | Nishimura | G06F 3/04144 |
| | | | | 73/862.046 |
| 2009/0061928 | A1* | 3/2009 | Lee | G06F 3/038 |
| | | | | 455/556.1 |
| 2010/0225604 | A1* | 9/2010 | Homma | G06F 3/044 |
| | | | | 345/173 |
| 2011/0050591 | A1* | 3/2011 | Kim | G06F 15/0291 |
| | | | | 345/173 |
| 2011/0167391 | A1* | 7/2011 | Momeyer | G06F 3/038 |
| | | | | 715/863 |
| 2012/0229401 | A1* | 9/2012 | Birnbaum | G06F 3/016 |
| | | | | 345/173 |
| 2012/0306798 | A1 | 12/2012 | Zoller et al. | |
| 2014/0253305 | A1* | 9/2014 | Rosenberg | G01L 1/22 |
| | | | | 340/407.2 |
| 2015/0002457 | A1* | 1/2015 | Woo | G06F 3/0416 |
| | | | | 345/174 |
| 2015/0054774 | A1* | 2/2015 | Fergusson | G06F 3/03 |
| | | | | 345/174 |
| 2015/0091858 | A1* | 4/2015 | Rosenberg | G06F 3/045 |
| | | | | 345/174 |
| 2017/0031495 | A1* | 2/2017 | Smith | G06F 3/0418 |
| 2017/0080249 | A1* | 3/2017 | Brawn | A61N 5/103 |
| 2017/0083126 | A1* | 3/2017 | Lim | G06F 3/0416 |
| 2017/0206393 | A1* | 7/2017 | Chia | G06F 21/32 |
| 2017/0249048 | A1* | 8/2017 | Hill | G06F 1/1694 |
| 2017/0285864 | A1* | 10/2017 | Pedder | H01L 27/323 |
| 2017/0359063 | A1* | 12/2017 | Oberhauser | H03K 17/962 |
| 2018/0067590 | A1* | 3/2018 | Wang | G06F 3/0412 |
| 2018/0088734 | A1* | 3/2018 | Barsness | G06F 3/0418 |
| 2018/0180450 | A1* | 6/2018 | Liu | G06F 1/1626 |
| 2018/0218859 | A1* | 8/2018 | Ligtenberg | H01H 13/703 |
| 2018/0260050 | A1* | 9/2018 | Unseld | G06F 3/0445 |
| 2018/0299996 | A1* | 10/2018 | Kugler | G06F 3/017 |
| 2019/0102031 | A1* | 4/2019 | Shutzberg | G06F 3/0418 |
| 2019/0212837 | A1* | 7/2019 | Wong | G06F 3/0383 |
| 2020/0033987 | A1* | 1/2020 | Fu | G06F 3/04886 |
| 2020/0097117 | A1* | 3/2020 | Sethuraman | G06F 3/0414 |
| 2020/0387224 | A1* | 12/2020 | Das | G06F 3/016 |
| 2021/0019009 | A1* | 1/2021 | Jung | G01D 5/2006 |

FOREIGN PATENT DOCUMENTS

| | | |
|---|---|---|
| KR | 10-0500270 | 7/2005 |
| KR | 10-2012-0125278 A | 11/2012 |
| KR | 10-2017-0054981 A | 5/2017 |
| KR | 10-1970558 | 4/2019 |

* cited by examiner

METHOD OF GENERATING OPERATION SIGNAL OF ELECTRONIC DEVICE, AND ELECTRONIC DEVICE

CROSS-REFERENCE TO RELATED APPLICATIONS

This application claims the benefit under 35 USC § 119(a) of Korean Patent Application No. 10-2020-0083285 filed on Jul. 7, 2020 in the Korean Intellectual Property Office, the entire disclosure of which is incorporated herein by reference for all purposes.

BACKGROUND

1. Field

The following description relates to a method of generating an operating signal of an electronic device, and an electronic device.

2. Description of Related Art

In general, wearable devices are preferred to have a thinner, simpler, and cleaner design, and. Therefore, existing mechanical switches are being used less frequently. This is possible with the implementation of dustproof and waterproof technologies, as well as the development of a model having a smooth design and unity of construction.

Currently, touch-on-metal (ToM) technology that touches on metal, capacitor sensing technology using a touch panel, micro-electro-mechanical-system (MEMS) and micro strain gauge technology are being developed. A force touch function is also being developed.

In the case of an existing mechanical switch, a large size and space are required internally for the implementation of a switch function, and since the mechanical switch has a structure that protrudes externally or that does not integrate with an external case, there is a disadvantage of poor design and a requirement for a lot of space.

In addition, there is a risk of electric shocks due to direct contact of a mechanical switch that is electrically connected. Additionally, there is a disadvantage that implementing dustproof and waterproof functions may be difficult due to the structure of a mechanical switch.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a method of generating an operating signal of an electronic device includes: deriving a force measurement value based on a change in inductance of a touch sensing device disposed inside a housing of the electronic device and configured to change inductance by external pressure applied to a touch switching unit of the housing; accumulatively recording the force measurement value derived in the deriving of the force measurement value; setting a reference value based on the recorded force measurement value, in response to the force measurement value being accumulatively recorded until a unit condition is satisfied; and generating an operating signal based on a high and low relationship between the force measurement value derived from the change in inductance occurring after the setting of the reference value, and the set reference value.

The touch sensing device may include: at least one sensing coil disposed on a substrate; and a sensing circuit unit electrically connected to the sensing coil and configured to detect an applied force input based on a change in inductance of the sensing coil.

The at least one sensing coil may include a plurality of sensing coils. The touch sensing device may respectively set the reference value based on a change in inductance occurring in the plurality of sensing coils.

The accumulatively recording of the derived force measurement value may include recording the derived force measurement value only when the derived force measurement value is equal to or greater than a preset force input reference value.

The unit condition may be satisfied when a number of samples of the recorded force measurement value is equal to or greater than a preset target sample number.

The number of samples of the recorded force measurement value may increase by 1 only in response to the derived force measurement value being greater than or equal to a preset force input reference value.

The unit condition may be satisfied when a measured elapsed time reaches a preset target time.

The setting of the reference value based on the recorded force measurement value may include: calculating an average value of the recorded force measurement value; and setting the calculated average value as the reference value.

A predetermined reference value may be stored in the electronic device. The setting of the calculated average value as the reference value may include setting the calculated average value as a new reference value, in response to the calculated average value being different from the predetermined reference value.

A plurality of different predetermined reference values may be stored in the electronic device. The method may further include: setting a first reference value, among the plurality of different predetermined reference values, as an initial reference value; and, as a result of sensing based on the first reference value, resetting a second reference value, among the plurality of predetermined reference values, as a new reference value, in response to a sensing success rate not being greater than a sensing error rate.

The plurality of different predetermined reference values may be classified into a plurality of reference value groups and stored. The setting of the first reference value as the initial reference value may include: adopting one reference value group matching pre-stored user information among the plurality of reference value groups; and setting one of a plurality of reference values included in the adopted one reference value group as the first reference value.

The adopting of the one reference value group matching pre-stored user information among the plurality of reference value groups may include adopting one reference value group corresponding to information regarding at least one of a pre-stored user age and a pre-stored user gender.

The adopting of the one reference value group matching pre-stored user information among the plurality of reference value groups may include: adopting one reference value group corresponding to a pre-stored user activity state; and, in response to a request to change the pre-stored user activity state, adopting a new reference value group according to the request to change.

In another general aspect, a non-transitory computer-readable storage medium stores instructions that, when executed by a processor, cause the processor to perform the method of claim 1.

In another general aspect, an electronic device includes: a housing including a touch switching unit; a substrate disposed inside the housing; at least one sensing coil disposed on the substrate and configured to exhibit a change in inductance in response to an external pressure applied to the touch switching unit; and a computer. The computer is configured to: derive a force measurement value based on the change in inductance; accumulatively record the derived force measurement value; set a reference value based on the recorded force measurement value, in response to the derived force measurement value being accumulatively recorded until a unit condition is satisfied; and generate an operating signal based on a high and low relationship between the force measurement value derived from a change in inductance that occurs after setting the reference value, and the set reference value.

In the housing, the touch switching unit, and at least a portion other than the touch switching unit may be flat with respect to each other.

The electronic device may further include a display member configured to display information based on the operating signal. The touch switching unit may be disposed not to overlap with an output direction of display information of the display member.

The computer may be further configured to: receive and process a registration request or a change request for any one or any combination of any two or more of the unit condition, user information, reference value information, and reference value group information, in response to the registration request or the change request being input through the display member; and enable a result of the processing of the registration request or the change request to be output through the display member.

A plurality of different predetermined reference values may be stored in the electronic device. The computer may be further configured to: set a first reference value, among the plurality of predetermined reference values, to an initial reference value; and reset a second reference value, among the plurality of predetermined reference values, to a new reference value, in response to a sensing success ratio not being greater than a sensing error ratio in a sensing result based on the first reference value.

The electronic device may further include an elastic member configured to be compressed as external pressure is applied to the touch switching unit, to enable the substrate to descend. The at least one sensing coil may include: a first sensing coil; and a second sensing coil disposed to face a direction opposite to a direction faced by the first sensing coil. The substrate may be disposed between the first sensing coil and the second sensing coil.

In another general aspect, an electronic device includes: a housing; a touch sensing device configured to exhibit changes in inductance in response to external pressures applied to the housing; and a processor. The processor is configured to: generate force measurement values corresponding to the changes in inductance; generate operating signals based on comparisons between the generated force measurement values and a stored reference value; accumulatively record the generated force measurement values; and update the stored reference value based on the accumulatively recorded generated force measurement values, in response to a preset condition being satisfied.

The preset condition may be satisfied when the accumulatively recording is performed a predetermined number of times, or when a measured elapsed time reaches a preset target time.

The updating of the stored reference value may include replacing the stored reference value with an average value of the accumulatively recorded generated force measurement values.

The stored reference value may be preset based on any one or any combination of any two or more of an input age of a user of the electronic device, an input gender of the user, and an input activity level of the user.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
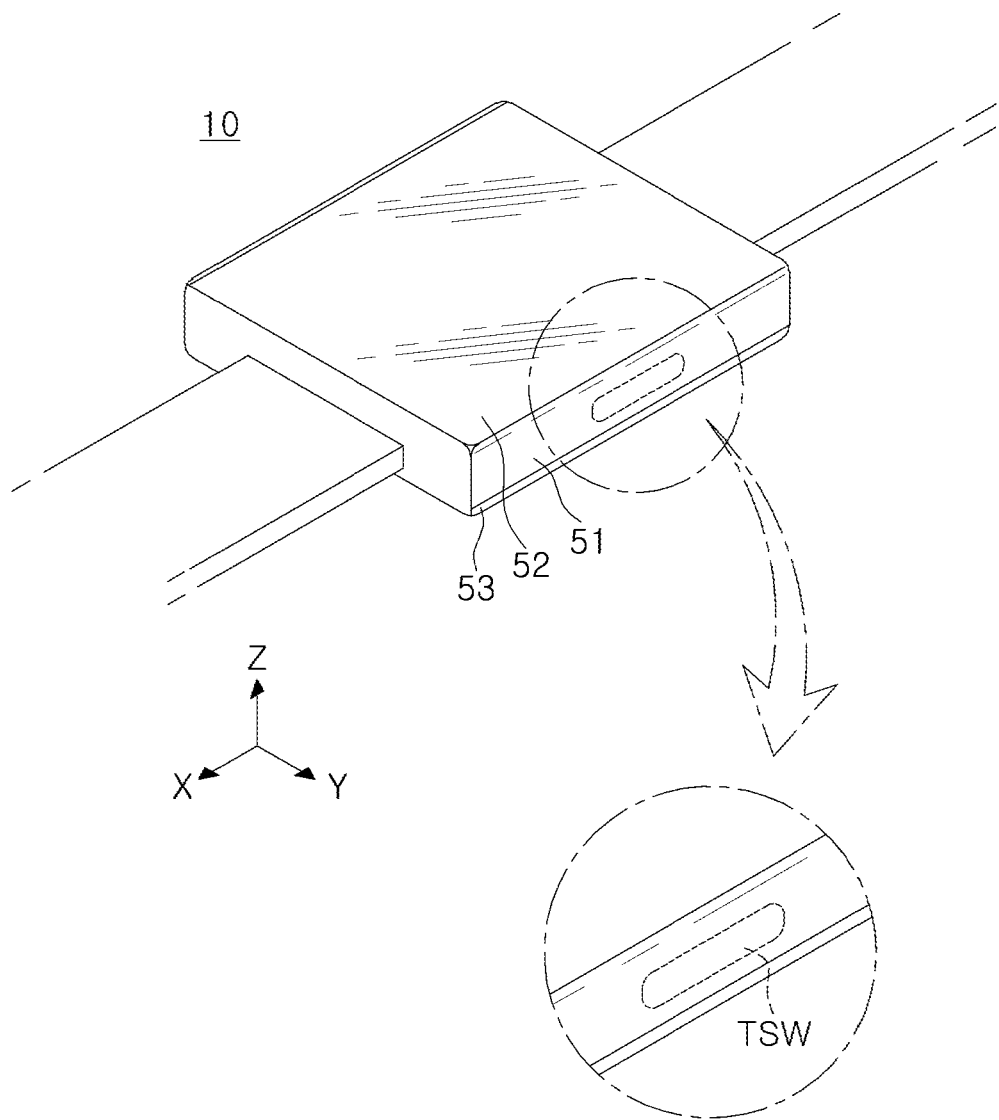
FIG. 1 is a drawing illustrating an exterior of an electronic device, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

FIG. 1 is a drawing illustrating an exterior of an electronic device 10, according to an example.

Referring to FIG. 1, the electronic device 10 may include a housing 51, a front display glass 52, a rear cover 53, and a touch switching unit TSW.

The housing 51 is a structure for covering at least a portion of the electronic device 10, and may be integrally formed with a structure for forming a central skeleton of the electronic device 10. The housing 51 may be formed of various materials according to a type and configuration of the electronic device 10. For example, when the electronic device 10 is a smartwatch as illustrated by way of example in FIG. 1, the housing 51 may be formed of a metal frame material. In addition, the housing 51 may also be formed of a non-conductive material such as glass.

The front display glass 52 may be disposed on one side of the housing 51, and the rear cover 53 may be disposed on the other side of the housing 51 or integrally formed with the housing 51. For example, the electronic device 10 may include a side surface of a two-to three-layer structure composed of the front display glass 52, the housing 51, and the rear cover 53.

The touch switching unit TSW may be a portion formed on a side surface of the electronic device 10 to replace a mechanical button. The touch switching unit TSW may correspond to a portion to which a touch input is applied, for example, a contact surface to which pressure is applied by a user's hand, according to an example. In addition, referring to FIG. 1, the touch switching unit TSW may correspond to at least a portion of the housing 51.

Referring to FIG. 1, the electronic device 10 may be a portable device such as a smartphone or the like, and may be a wearable device such as a smartwatch. However, the electronic device 10 is not limited to a specific device, and may be portable or wearable electronic device, or an electronic device having a switch for controlling operation thereof. For example, examples of the electronic device 10 include a smartphone, a personal digital assistant, a digital video camera, a digital still camera, a network system, a monitor, tablet, laptop, netbook, television, video game, automotive components, and the like, but are not limited thereto.

As illustrated in FIG. 1, the touch switching unit TSW, and at least a portion of the housing 51 other than the touch switching unit TSW, may be flat or level with respect to each other. For example, the area corresponding to the touch switching unit TSW may not protrude or be recessed from other areas in the housing 51, and may be smoothly formed.

In contrast to the electronic device 10 of FIG. 1, in a case of an electronic device such as a conventional mobile phone, a volume button or a power button may be formed on the side surface of the electronic device as a physical button (key). In this case, the physical button protrudes externally so that it may be pressed with a user's hand. However, when using a physical button, there is a durability issue due to a cause of wear and the like, and there is a limitation that waterproof processing of the physical button is difficult.

Figure 2A:
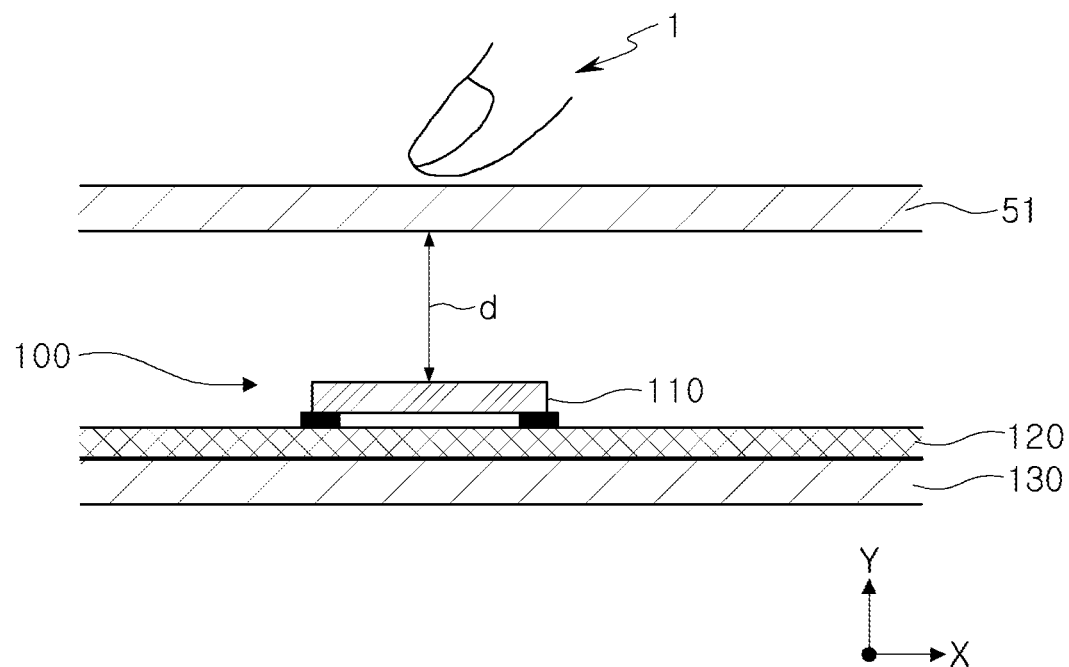
FIG. 2A is a drawing of a state in which external pressure is not applied to an electronic device, according to an example.
Figure 2B:
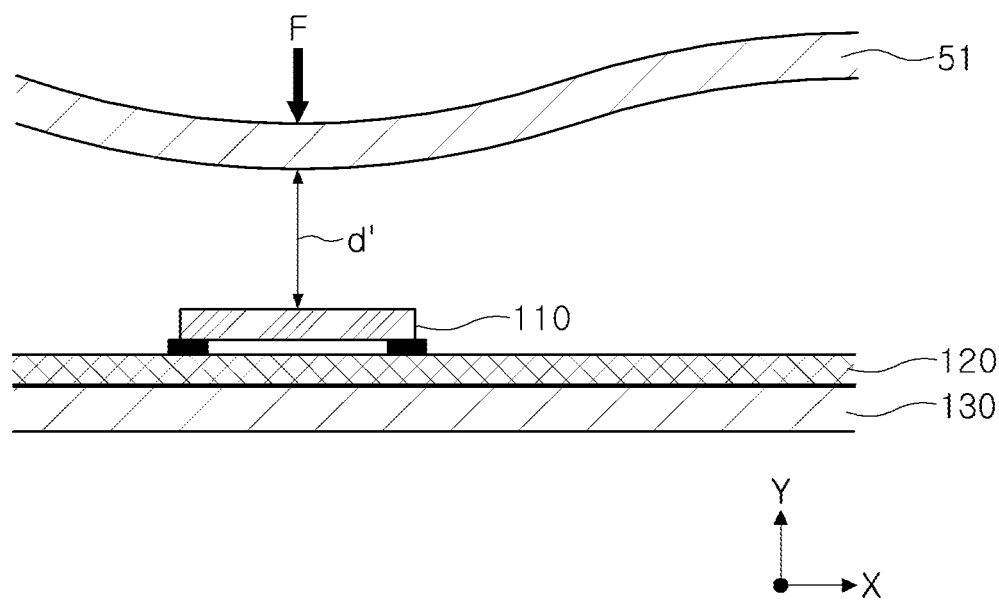
FIG. 2B is a drawing of a state in which external pressure is applied to the electronic device, according to an example.

FIG. 2A is a view illustrating a state in which external pressure is not applied to the electronic device 10, according to an example. FIG. 2B is a view illustrating a state in which external pressure is applied to the electronic device 10, according to an example.

Referring to FIGS. 1 and 2A and 2B, an example concept of the disclosure herein is to sense the degree to which the housing 51 is bent inward when pressure is applied to the touch switching unit TSW with the user's hand 1, and to enable touch input on a side surface of the electronic device 10 without a physical button.

As described with reference to FIG. 1, the electronic device 10, such as a smartwatch, includes the housing 51, such as a metal frame, in a center portion of the electronic device 10, the front display glass 52 disposed on the housing 51, and the rear cover 53 disposed below the housing 51. The rear cover 53 may be, for example, a back glass.

In more detail, referring to FIG. 2A, the housing 51 may have the touch switching unit (TSW) in at least a portion thereof.

In addition, the electronic device 10 may include a touch sensing device 100, and the touch sensing device 100 may be disposed inside the housing 51. The touch sensing device 100 may sense external pressure applied to the touch switching unit TSW.

The touch sensing device 100 is a device capable of detecting a touch input. For reference, in this disclosure, touch, touch input, and touch application may include a contact touch that makes contact without a force and a force touch that involves a force pressed by force (pressure). The description herein is focused on detecting the force touch input by inductive sensing.

For example, referring to FIGS. 1 and 2A, a force may be applied to the touch switching unit TSW of the housing 51 by the user's hand 1. Accordingly, the housing 51 may be bent inward around the position of the touch switching unit TSW, and the size of an air gap formed by the touch sensing device 100 and the housing 51 may be changed.

In this case, when the size of the air gap changes, the inductance changes. Therefore, when a change in inductance of a reference value or more is detected, the touch sensing device 100 may detect that a force touch input is applied to the touch switching unit TSW.

Referring to FIGS. 2A and 2B, the touch sensing device 100 may include a sensing coil 110, a substrate 120, and a support 130. At least one sensing coil 110 may be disposed on the substrate 120. In addition, the substrate 120 may be fixed to the inside of the housing 51 by the support 130.

When the touch sensing device 100 is inserted into the electronic device 10, the support 130, the substrate 120, and the sensing coil 110 may be disposed parallel to the inner surface of the housing 51. In this case, the sensing coil 110 is disposed in an uppermost portion of the touch sensing device 100 and is installed to be spaced apart from the housing 51, and an air gap may be formed between the sensing coil 110 and the housing 51.

The shape of the sensing coil 110 is not particularly limited, and a coil pattern may be formed in various shapes such as a circle or a quadrangular shape. Further, the sensing coil 110 may also be in the form of a wiring pattern on a PCB or an FPCB, or may be in the form of a chip inductor.

The touch sensing device 100 may detect that the housing 51 is deformed by the force of the user's hand 1 pressing the touch switching unit TSW. For example, when the user's hand 1 presses the touch switching unit TSW, the housing 51 is bent in the form such that the housing 51 is moved closer to the sensing coil 110, and accordingly, the distance between the sensing coil 110 and the housing 51 will change.

For example, the housing 51 may be formed of aluminum or a metal. As an example, while current flows through the sensing coil 110, the distance between the housing 51 formed of a metallic material, which is a surrounding conductor, and the sensing coil 110, may be changed to generate an eddy current. In addition, a change in inductance of the sensing coil 110 occurs due to the eddy current generated by the change in distance.

In addition, a resonance frequency may change according to a change in inductance. The touch sensing device 100 may detect a change in pressure applied to the touch switching unit TSW, based on the change in the resonance frequency described above, and may recognize the change in pressure as a force touch input.

The substrate 120 may be an FPCB, but is not limited thereto. For example, various types of substrates having a structure in which at least one metal layer other than the FPCB, and at least one insulating layer, are alternately stacked may be used as the substrate 120. The at least one sensing coil 110 is disposed on one surface of the substrate 120, and a plurality of the sensing coils 110 may be electrically connected to each other by the substrate 120. In addition, a sensing circuit unit 200 (FIG. 5), to be described later, and the sensing coil 110 may also be electrically connected to each other by the substrate 120.

The support 130 may fix the substrate 120 on which the sensing coil 110 is disposed. In addition, the support 130 may be attached to the internal structure of the electronic device 10 as illustrated in FIGS. 2A and 2B. The support 130 may be implemented in various ways depending on a type of electronic device 10 and a shape of the internal structure of the electronic device 10, and is not limited to a special shape or structure. For example, the support 130 may have any structure (for example, a bracket, or the like) in which the substrate 120 is fixed to one surface, and at least a portion of the structure may be attached to the internal structure of the electronic device 10. In this case, the touch sensing device 100 including the support 130 may be inserted in the inside of the electronic device 10.

Figure 3:
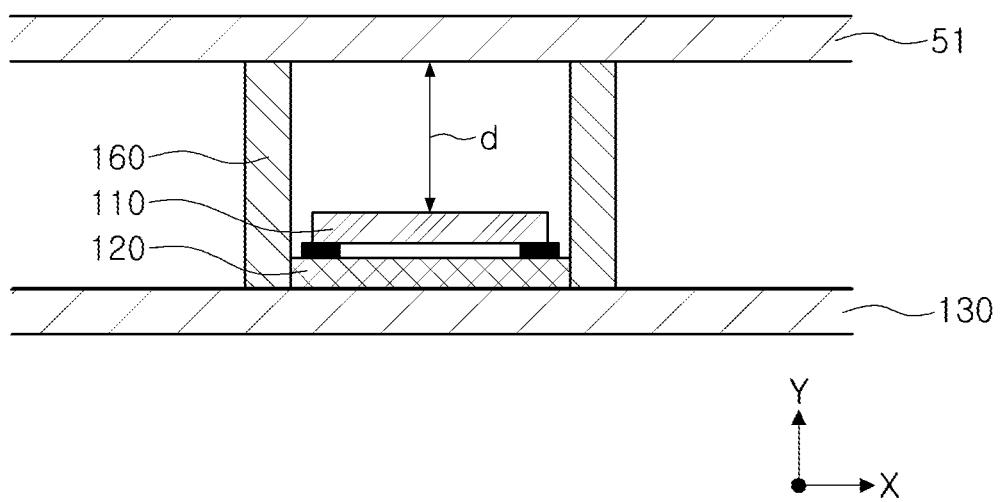
FIG. 3 is a drawing in which support connecting portions are included in a touch sensing device of FIGS. 2A and 2B, according to an example.

Referring to FIG. 2A, the touch sensing device 100 according to an example may be disposed inside the housing 51. For example, as illustrated in FIG. 3, the housing 51 may have an interior space having a spacing of d, and the touch sensing device 100 may be inserted detachably into the interior space. In this case, the support 130 may be attached to one surface of the housing 51, and the substrate 120 on which the sensing coil 110 is disposed may be fixed to the support 130.

In addition, as illustrated in FIG. 3, the sensing coil 110 disposed in an uppermost portion of the touch sensing device 100 may be installed spaced apart from the housing 51. In this case, an air gap having a distance corresponding to d may be formed between the sensing coil 110 and the housing 51.

Referring to FIG. 2B, when external pressure F is applied to the housing 51, deformation of the housing 51 may occur. For example, the inner side (a lower side in FIGS. 2A and 2B) of the housing is bent around the touch switching unit TSW, which is the point to which the pressure is directly applied.

The housing 51 may be formed of a ductile material, and thus, may easily deform as the user applies pressure thereto. In addition, by being formed of a material having elasticity, a return of the housing 51 to an original position after deformation may be facilitated. For example, the housing 51 may be formed of various metals, and may be formed of an alloy in which a metal material such as soft iron, tungsten, phosphor bronze, chromoly or the like is added.

Comparing FIG. 2A illustrating the state before deformation and FIG. 2B illustrating the state after deformation, it can be seen that the air gap between the housing 51 and the sensing coil 110 is reduced from the distance d to the distance d' as the housing 51 is deformed by an external pressure F.

For example, while current flows through the sensing coil 110, the distance d between the sensing coil 110 and the housing 51 is reduced, and an eddy current may be generated. In addition, a change in inductance and a resonance frequency of the sensing coil 110 occurs due to the eddy current generated according to the change in distance.

In this case, the sensing circuit unit 200 may determine whether the corresponding pressing operation is a normal force input based on a change in inductance and a change in resonance frequency.

Even when pressure is applied to the touch switching unit TSW of the housing 51 as illustrated in FIG. 2B, the pressure may be detected as a normal force input only when the magnitude of the pressure is equal to or greater than a preset reference value. For example, a user may unintentionally touch the touch switching unit TSW while carrying the electronic device 10. Therefore, in the sensing circuit unit 200, when the distance between the sensing coil 110 and the housing 51 decreases to have a change amount equal to or greater than a preset reference value, it may be determined that external pressure is normally applied to the touch switching unit TSW.

FIG. 3 is a view illustrating an example in which support connecting portions 160 are included in the touch sensing device 100 of FIGS. 2A and 2B.

Referring to FIG. 3, the touch sensing device 100 may include at least one pair of support connecting portions 160. The pair of support connecting portions 160 may be installed in such a manner that first ends of the support connecting portions 160 are joined to the support 130 and the second ends of support connecting portions 160 are joined to the inner surface of the housing 51, and the support connecting portions 160 extend perpendicular to the support 130.

The sensing coil 110 may be disposed between the support connecting portions 160. For example, the support connecting portions 160 are respectively installed on both sides of the substrate 120 on which the sensing coils 110 are disposed, so that the space inside the housing 51 may be divided in the form of pillars or walls.

When the user applies pressure to the touch switching unit TSW, the support connecting portions 160 may allow a portion of the housing 51 to be easily bent inward. For example, the support connecting portions 160 may perform a function of setting deformation boundary points on both sides so that the housing 51 may be bent around the touch switching unit TSW to which pressure is applied by the user's hand 1.

The support connecting portions 160 may be formed of various materials, including conductive materials and non-conductive materials. For example, since it is sufficient for the support connecting portions 160 to perform the function of the deformed boundary point in the form of a column or a wall when the user applies pressure to the housing 51, it does not matter whether the support connecting portions 160 are formed of an insulator. On the other hand, since the structure of the electronic device 10 should be maintained despite the applied pressure and the deformation of the housing 51, it is desirable to form the support connecting portions 160 of a material having relatively high strength. In addition, since the support connecting portions 160 are components installed in the electronic device 10, a lightweight material may be used to form the support connecting portions 160.

Figure 4:
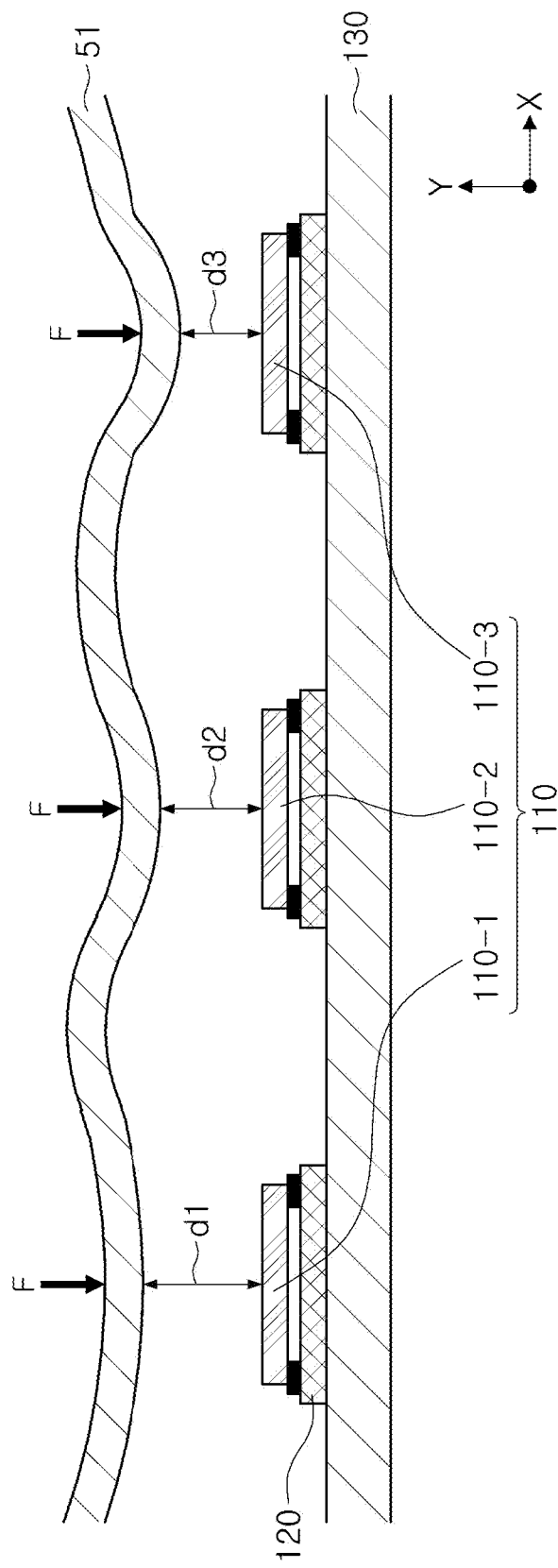
FIG. 4 is a drawing illustrating electronic devices in parallel, to which a plurality of different reference values having a differential are applied, according to an example.

FIG. 4 is a view illustrating electronic devices to which a plurality of different reference values having a differential are applied, in parallel, according to an example.

Referring to FIG. 4, the touch sensing device 100 may be configured to sense external pressures having different magnitudes by setting different reference values of the force input. For example, it may be detected that there is a normal force input only when an external pressure equal to or greater than a set reference value is applied.

Hereinafter, the force input refers to an input, among touch inputs, by force touch having applied pressure. In addition, in this case, although a reference value of the force input may be determined as a single value, a plurality of reference values may also be set at the same time, such that different types of force input depending on the magnitudes of applied pressures may be sensed. However, hereinafter, the touch sensing device 100 in which a single reference value is set will be described as an example.

In addition, in a case in which a plurality of touch switching units TSW are included in one electronic device 10, separate reference values may be set. For example, the touch sensing device 100 according to an example may include a plurality of sensing coils 110, and the reference values may be respectively set from changes in inductances occurring in the plurality of sensing coils 110. Such an example may be implemented in such a manner that the contents of the reference value of the touch sensing device 100 described herein are individually applied to the plurality of sensing coils 110.

In the electronic device 10, a plurality of reference values may be previously specified and stored. For example, as illustrated in FIG. 4, the electronic device 10 may store three predetermined reference values.

For example, a respective sensing coil 110 illustrated in FIG. 4 represents an example in which three differential reference values are applied in one touch sensing device 100, and for example, represents a case in which one reference value is selectively set among three reference values previously stored in the electronic device 10. In this case, in FIG. 4, a leftmost sensing coil 110-1 indicates that a lowest reference value is set, and an intermediate sensing coil 110-2 indicates that an intermediate reference value is set, and a rightmost sensing coil 110-3 indicates that a highest reference value is set.

In this case, the number of reference values that are pre-designated and stored may be various, but a case in which three reference values are stored will be illustrated as an example as illustrated in FIG. 4. In addition, in this specification, the lowest reference value among the three previously stored reference values will be defined as a first reference value, the intermediate reference value as a second reference value, and the highest reference value as a third reference value.

By storing a plurality of reference values as described above, one reference value that is most suitable according to various conditions such as a user characteristics or activity status may be set and used. For example, when an elderly female with weak grip is a user of the electronic device 10, the first reference value may be selected and set as illustrated in the leftmost sensing coil 110-1 in FIG. 4. Then, even when the user applies a weak pressure to the touch switching unit TSW, a force input may be detected.

Conversely, when a strong male with strong grip strength is a user of the electronic device 10, the third reference value may be selected and set as illustrated in the rightmost sensing coil 110-3 in FIG. Then, only the case in which the user applies a strong pressure to the touch switching unit TSW is detected as a force input, and the weak pressure generated in the process of carrying the electronic device 10 is recognized as a simple touch and is not detected as a force input.

In detail, since the leftmost sensing coil 110-1 of FIG. 4 represents the case in which the first reference value is applied, the first reference value may indicate a measured value of pressure applied to the touch switching unit TSW when the distance between the housing 51 and the sensing coil 110 is reduced to correspond to d1. For example, when the distance between the housing 51 and the sensing coil 110 reaches d1, the change amount of the inductance generated in the sensing coil 110 becomes the change amount of the inductance according to the first reference value. Accordingly, when the first reference value is set as the reference value of the touch sensing device 100, the corresponding pressure may be detected as a force input only when the distance between the housing 51 and the sensing coil 110 is reduced to d1 or less.

In a different manner, the rightmost sensing coil 110-3 of FIG. 4 represents a case in which the third reference value is applied, and thus, the third reference value may indicate a measured value of pressure applied to the touch switching unit TSW when the distance between the housing 51 and the sensing coil 110 decreases to correspond to d3. For example, when the distance between the housing 51 and the sensing coil 110 reaches d3, the change amount of the inductance generated in the sensing coil 110 becomes the change amount of the inductance according to the third reference value. Accordingly, for example, when the third reference value is set as the reference value of the touch sensing device 100, the corresponding pressure may be detected as a force input only when the distance between the housing 51 and the sensing coil 110 is reduced to d3 or less.

For example, in a case in which the distance between the housing 51 and the sensing coil 110 decreases to d1 when the third reference value is set, an inductance change of a magnitude less than the reference value occurs in the sensing coil 110. Accordingly, the touch sensing device 100 may determine that the pressure applied to the touch switching unit TSW is not sufficient, and may determine that there is a simple touch (a contact touch without applied pressure) rather than a force input.

On the other hand, after a plurality of reference values are pre-designated and stored, a manner in which one reference value thereamong is set may be diverse. According to an example, whenever a pressure is applied to the touch switching unit TSW, the force measurement value may be cumulatively recorded. Since the recorded force measurement values may provide the user pressing pattern, one most suitable reference value may be set, based on the provided pressing form.

In addition, not only one reference value is set from the previously stored reference values, but also a detailed numerical value of the reference value may be finely adjusted. For example, even when a reference value of one of the previously stored reference values is set, a new reference value may be generated based on the cumulatively recorded user force measurement values.

As the user uses the touch sensing device 100, force measurement values are accumulated, and a plurality of force measurement values may be recorded until a unit condition stored in the electronic device 10 is satisfied. As a result of analyzing the recorded force measurement values, when it is determined that the existing reference value is not suitable, the reference value may be changed and newly set. For example, the electronic device 10 may be allowed to access a user-defined reference value by continuously updating the reference value according to a specified unit condition.

Figure 5:
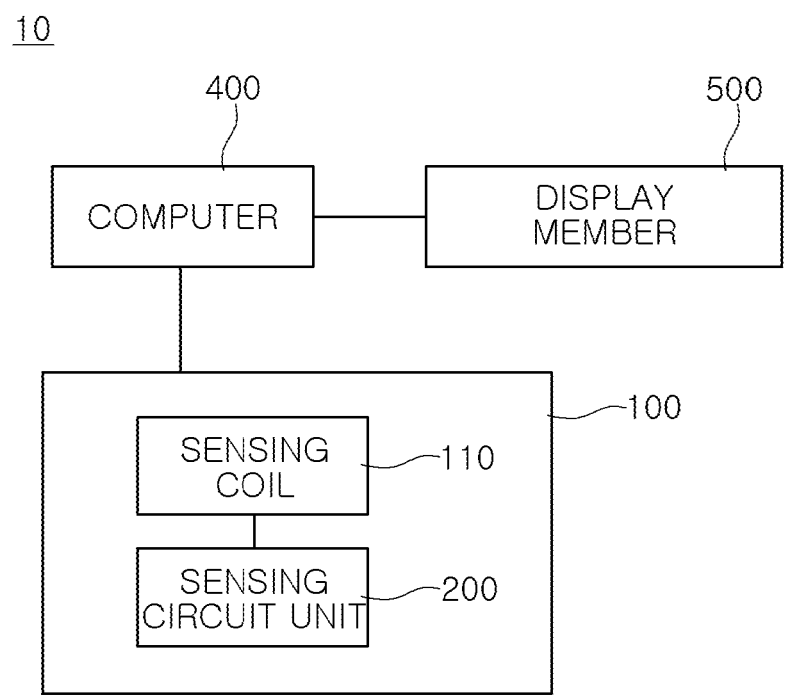
FIG. 5 is a schematic block diagram of an electronic device, according to an example.
Figure 6:
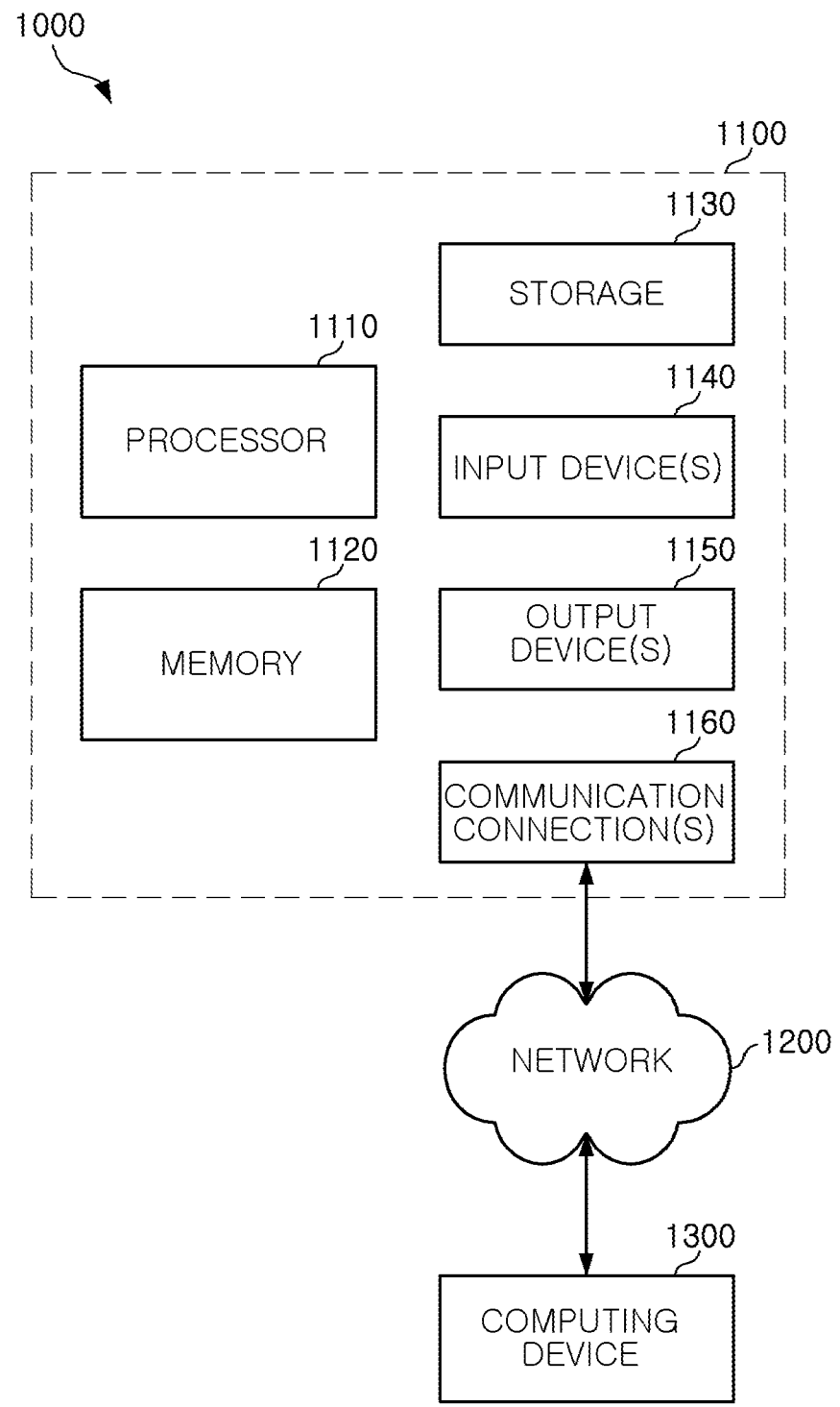
FIG. 6 is a diagram illustrating a computing environment in which one or more examples set forth herein may be implemented, in an example.

FIG. 5 is a schematic block diagram of the electronic device 10, according to an example. FIG. 6 is a diagram illustrating an example of a computing environment in which one or more examples disclosed herein may be implemented.

Referring to FIG. 5, the electronic device 10 may include the touch sensing device 100, a computer 400, and a display member 500. In addition, as described above, the electronic device 10 includes the housing 51 having the touch switching unit TSW, such that the inductance may be changed depending on an external pressure applied to the touch switching unit TSW.

The touch sensing device 100 may include the at least one sensing coil 110 disposed on the substrate 120. In addition, the touch sensing device 100 may include the sensing circuit unit 200 electrically connected to the sensing coil 110 to detect the application of a force input from a change in inductance of the sensing coil 110. In this case, the sensing circuit unit 200 may correspond to a sensor IC (integrated circuit).

The sensing circuit unit 200 may detect the application of external pressure based on the change in inductance of the sensing coil 110. For example, when pressure is applied to the housing 51, the distance between the housing 51 and the sensing coil 110 may be changed to generate an eddy current. Accordingly, a change may occur in the inductance of the sensing coil 110. The sensing circuit unit 200 may detect a change in the resonance frequency from the above-described change in inductance, and accordingly, may recognize that a force input is applied to the touch switching unit TSW.

The computer 400 may be configured to process various electronic functions performed by the electronic device 10. For example, the computer 400 may receive various pieces of information or signals input to the electronic device 10, or transmit information or signals to other devices or servers. In addition, the computer 400 may store various pieces of information used for the operation of the electronic device 10, and may manage information such as loading or registering/deleting the stored information. In addition, the computer 400 may process information such as analysis, judgment, and processing using received or stored information.

For example, the computer 400 may correspond to a computing device 1100 illustrated in FIG. 6. For example, the computer 400 and the computing device 1100 may be equally applied to the electronic device 10. In this specification, the configuration described as the computer 400 may be replaced by the computing device 1100, and the configuration described as the computing device 1100 may be replaced by the computer 400.

FIG. 6 illustrates an example of a system 1000 that includes the computing device 1100 configured to implement one or more of the examples described above. For example, the computing device 1100 may be a personal computer, a server computer, a handheld or laptop device, a mobile device (mobile phone, PDA, media player or the like), a multiprocessor system, consumer electronics, a mini computer, a mainframe computer, distributed computing environments including any of the aforementioned systems or devices, and the like, but is not limited to the foregoing examples.

The computing device 1100 may include at least one processor 1110 and memory 1120. In this case, the processor 1110 may include, for example, a central processing unit (CPU), a graphics processing unit (GPU), a microprocessor, an application specific integrated circuit (ASIC), or field programmable gate arrays (FPGA), and may have a plurality of cores. The memory 1120 may be a volatile memory (e.g., a RAM, etc.), a non-volatile memory (e.g., a ROM, a flash memory, etc.) or a combination of a volatile memory and a non-volatile memory.

Also, the computing device 1100 may include additional storage 1130. The storage 1130 includes, but is not limited to, a magnetic storage, an optical storage, and the like. Computer-readable instructions for implementing one or more examples disclosed herein may be stored in the storage 1130, and other computer-readable instructions for implementing an operating system, application programs, and the like may also be stored in the storage 1130. Computer-readable instructions stored in the storage 1130 may be loaded into the memory 1120 for execution by the processor 1110.

Further, the computing device 1100 may include an input device(s) 1140 and an output device(s) 1150. The input device(s) 1140 may include, for example, a keyboard, a mouse, a pen, a voice input device, a touch input device, an infrared camera, a video input device, or any other input device. Further, the output device(s) 1150 may include, for example, one or more displays, a speaker, a printer, or any other output device. Further, the computing device 1100 may also use an input device or output device provided in another computing device as the input device(s) 1140 or the output device(s) 1150.

Further, the computing device 1100 may include a communication connection(s) 1160 that enables communication with other devices (e.g., the computing device 1300) through a network 1200. In this case, the communication connection(s) 1160 may include a modem, a network interface card (NIC), an integrated network interface, a radio frequency transmitter/receiver, an infrared port, a USB connection, or other interfaces for connecting the computing device 1100 to another computing device. Further, the communication connection(s) 1160 may include a wired connection or a wireless connection.

Respective components of the above-described computing device 1100 may be connected by various interconnections such as a bus (e.g., a peripheral component interconnection (PCI), USB, firmware (IEEE 1394), an optical bus structure or the like), and may also be interconnected by a network. In addition, as described above, the contents of the computing device 1100 described above may be applied to the computer 400.

The computer 400 or the computing device 1100 may generate an operating signal according to a force input. In detail, a force measurement value may be derived from a change in inductance of at least one sensing coil 100, and the derived force measurement value may be cumulatively recorded. In addition, when the force measurement value is recorded until the unit condition is satisfied, a reference value may be set from the recorded force measurement value. In addition, an operating signal may be generated based on a high and low relationship between a force measurement value derived from a change in inductance occurring after setting the reference value, and the set reference value.

The force measurement value corresponds to a value obtained by converting the magnitude of the pressure applied to the touch switching unit TSW from the amount of change in inductance generated in the sensing coil 110. For example, the parameter is not necessarily determined in the force measurement value, and a value expressed in proportion to the variation in inductance within the numerical range in which the variation in inductance is formed is sufficient. For example, the force measurement value may be a value indicated by a hundredth ($1/100$) of a range of the inductance change amount that may be measured through the touch sensing device 100, which is only an example. Therefore, the force measurement value may be determined in various methods according to characteristics and functions of the computer 400 or the computing device 1100 installed in the electronic device 10.

The unit condition may indicate a time condition or a number of times conditions in which the force measurement value should be cumulatively recorded to set a new reference value. Alternatively, a specific condition occurring in the electronic device 10, rather than a specific time or number of times, may also be set as the unit condition. Details of the unit condition, according to an example, will be described later in detail with reference to FIGS. 8 to 10.

Referring to FIG. 5, the display member 500 may output display information based on an operating signal generated by the computer 400. In addition, the user may input necessary information to the electronic device 10 through the display member 500, and, for example, the input method of the information may correspond to input by a touch. Accordingly, the display member 500 may include a touch screen panel (TSP).

Information input by the user through the display member 500 may be various, and may correspond to, for example, unit conditions, user information, reference value information, or reference value group information. Also, a registration request or a change request for at least one of the various pieces of information may be input through the display member 500.

The registration request or change request input through the display member 500 may be received and processed by the computer 400. When the request is processed by the computer 400, the display member 500 may output a processed result and provide the result to the user.

Additionally, the touch switching unit TSW may be disposed not to overlap the display information output direction of the display member 500. For example, as illustrated in FIG. 1, the display member 500 may be disposed on the front of the exterior of the electronic device 10, and the housing 51 and the touch switching unit TSW may be disposed on the side of the exterior. Accordingly, an input applied to either the display member 500 or the touch switching unit TSW by the user may be prevented from causing a malfunction.

FIGS. 7 to 13 illustrate various methods of generating an operating signal of an electronic device, according to examples. For example, the respective operations illustrated in FIGS. 7 to 13 may be performed by the computer 400 or the computing device 1100.

Figure 7:
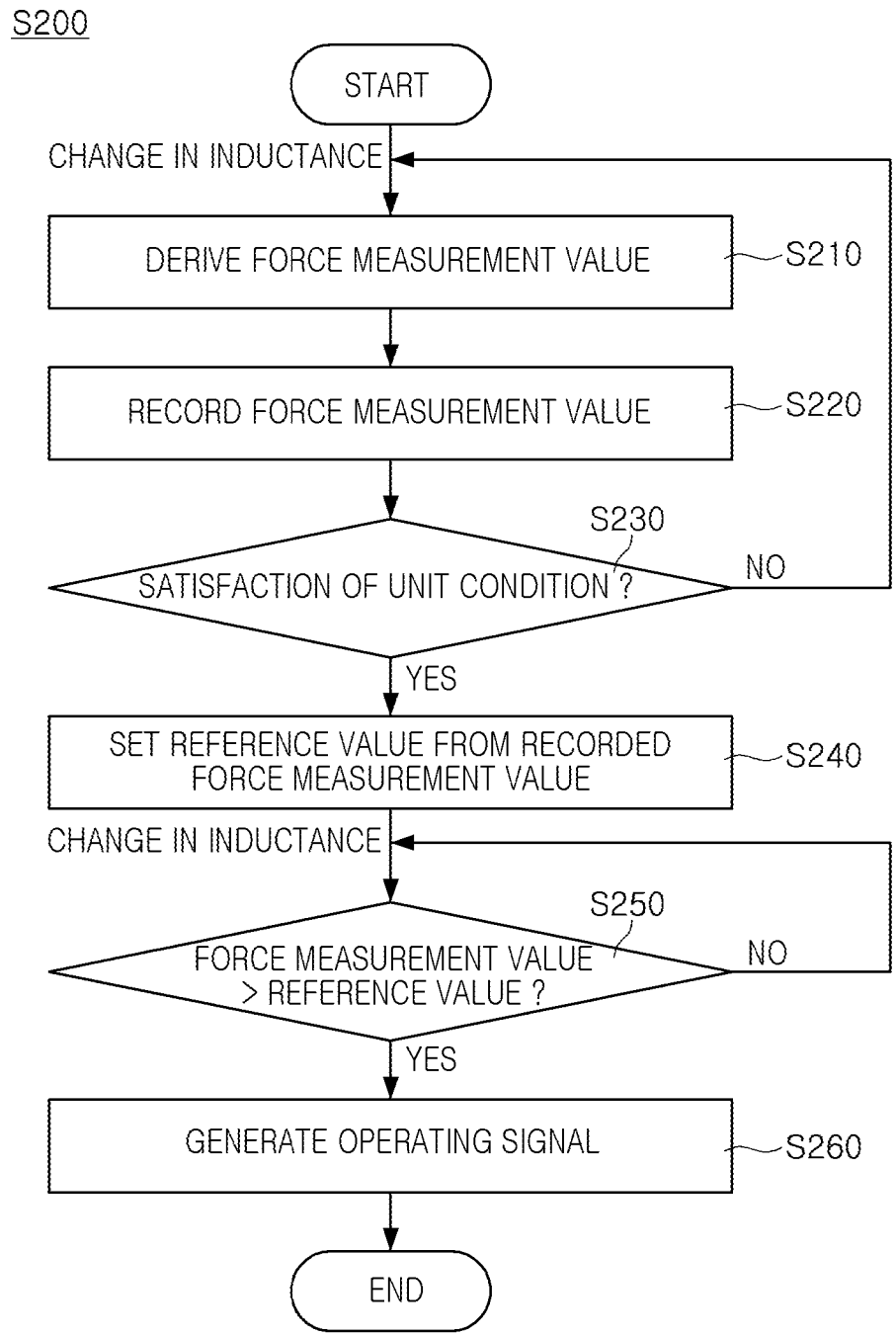
FIG. 7 is a flowchart illustrating a method of generating an operating signal of an electronic device, according to an example.

FIG. 7 is a flowchart of a method S200 for generating an operating signal of an electronic device, according to an example.

As illustrated in FIG. 7, according to an example, as a change in inductance is sensed, a force measurement value may be derived therefrom in operation S210. In addition, in operation S220, the derived force measurement value may be recorded in a memory or storage (e.g., the storage 1130 included in the computing device 1100) capable of storing data of the electronic device 10.

Each time the user applies pressure to the touch switching unit TSW of the electronic device 10, a change in inductance occurs in the sensing coil 110, and a corresponding force measurement value may be derived. As described above, when the force measurement value is cumulatively recorded in operation S220, a point in time at which the unit condition set in the electronic device 10 is satisfied may be reached. When, in operation S230, it is determined that the unit condition is satisfied, a reference value may be set from the recorded force measurement value, in operation S240. On the other hand, the process of deriving the force measurement value according to the change in inductance in operation S210 and recording (the derived force measurement value in operation S220 may be repeated until the unit condition is satisfied.

Subsequently, when, in operation S240, a reference value is set from the recorded force measurement value, a normal force input is sensed based on the set reference value. For example, in operation S250, after setting the reference value, it is determined whether the user force measurement value of the pressure applied to the touch switching unit TSW exceeds the set reference value.

As a result of the determination, when the force measurement value exceeds the reference value, it may be detected that a normal force input is applied. Accordingly, an operating signal according to the force input may be generated in operation S260. However, when the force measurement value does not reach the reference value, it may be determined that a simple touch or malfunction has occurred, and an operating signal may not be generated.

As described above, the method S200 for generating an operating signal of the electronic device 10 may include deriving a force measurement value from a change in inductance (operation S210), accumulatively recording the derived force measurement value (operation S220), setting a reference value from the recorded force measurement value (operation S240) in response to the force measurement value being recorded until the unit condition is satisfied (operation S230), and generating an operating signal (operation S260), based on the high and low relationship between the set reference value and the force measurement value derived from the change in inductance that occurs after setting the reference value (operation S250).

The operation S220 of accumulatively recording the derived force measurement value may include operations S350 and S460 of recording the derived force measurement value only when the derived force measurement value is determined to be greater than or equal to a preset force input reference value (operations S330 and S440), which will be described with reference to FIGS. 8 and 9 together.

Figure 8:
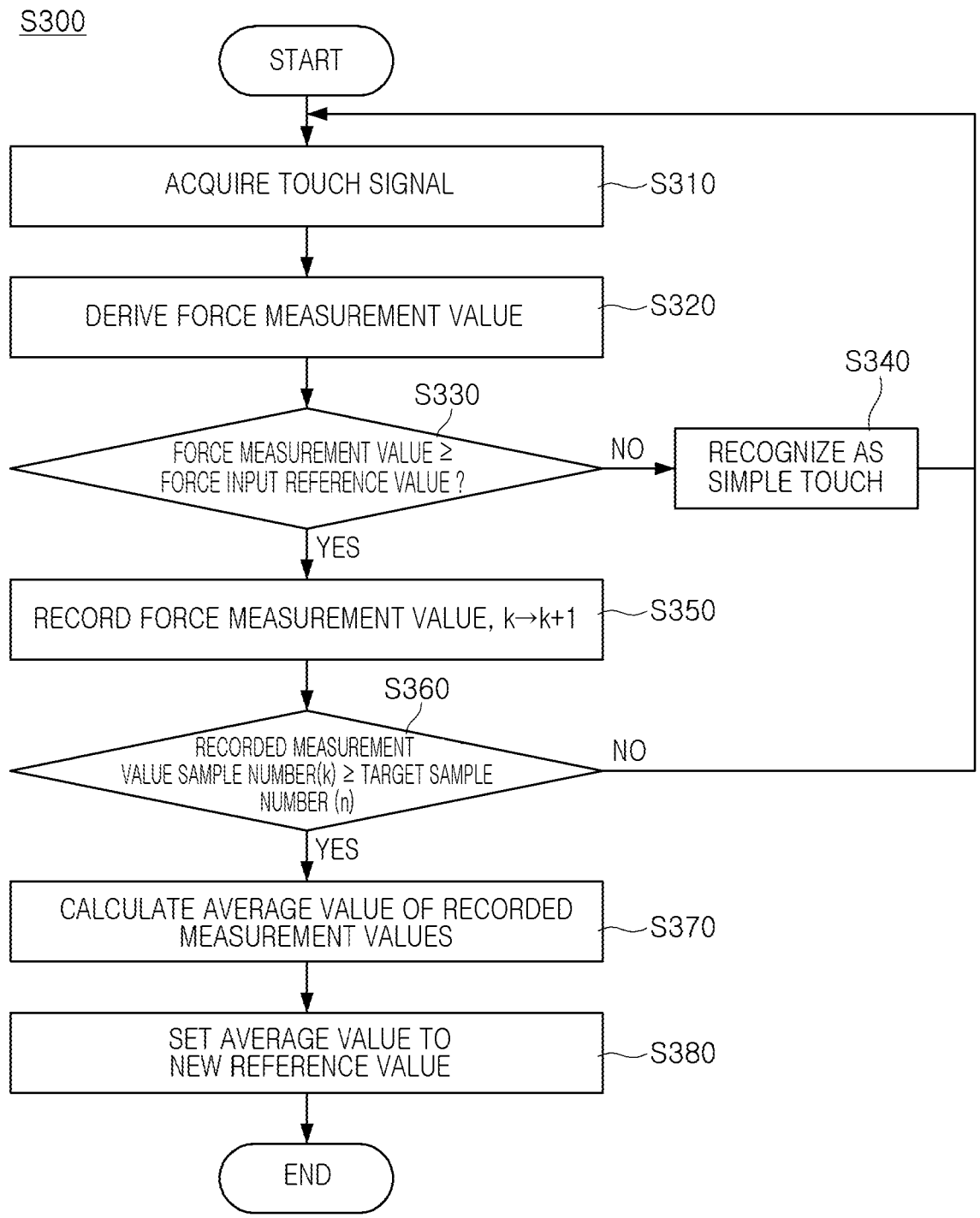
FIG. 8 is a flowchart of a method for setting a new reference value when a force measurement value is recorded a target sample number or more, according to an example.

FIG. 8 is a flowchart of a method S300 in which a new reference value is set when the force measurement value is recorded more than or equal to a target sample number, according to an example.

Referring to FIG. 8, in the method of generating an operating signal of the electronic device 10, the unit condition may indicate that the sample number k of the recorded force measurement value reaches the target sample number n.

As illustrated in FIG. 8, in the method S300, as a touch signal is acquired by the touch switching unit TSW in operation S310, a force measurement value may be derived based on the change amount of the inductance, in operation S320. Then, in operation S330, the derived force measurement value may be cumulatively recorded, and it may be determined whether the force measurement value corresponds to a force input reference value or more.

In this case, the force input reference value is a lower limit value that is set to determine when the magnitude of pressure applied by the user to the touch switching unit TSW is small enough to be regarded as a simple touch operation rather than a force input. For example, a force measurement value having a value less than the force input reference value may be recognized as a simple touch operation for all users regardless of the reference value setting depending on users.

When the force input reference value is set, in a mechanism in which a new reference value is set by the computer 400, a simple touch operation may be preferentially filtered. Therefore, the working speed and memory usage of the computer 400 may be improved. In this case, not only the magnitude of the pressure exerted by the user, but also the duration of pressurization may be considered.

As a result of the determination, when the force measurement value is equal to or greater than the force input reference value, the corresponding force measurement value may be recorded in operation S350. In addition, in this case, the number (k) of samples of the recorded force measurement value may be further increased by 1 (k+1). On the other hand, when the force measurement value is less than the force input reference value, the pressure applied by the user is recognized as a simple touch in operation S340, and the corresponding force measurement value is not recorded. In this case, there is no room for an increase in the number (k) of samples of recorded force measurement value.

Subsequently, when the force measurement value is recorded in operation S350, it may be determined whether the number (k) of samples of recorded force measurement value has reached a value equal to or greater than the target sample number n, in operation S360. For example, it is determined whether the unit condition for the target sample number n stored in the electronic device 10 is satisfied.

When it is determined, in operation S360, that the force measurement value is accumulated to have a value greater than or equal to the target sample number (n), a reference value based on the recorded force measurement value may be set. In this case, the manner in which the reference value is set may be diverse, and for example, as illustrated in FIG. 8, the average value of the recorded force measurement values may be calculated in operation S370. The calculated average value is set as a reference value of the corresponding touch sensing device 100 in operation S380, and then force sensing may be performed on the pressure applied by the user based on the set reference value.

On the other hand, when the number (k) of samples of recorded force measurement value does not reach the target sample number (n), the operation S350 of recording the force measurement value in response to the touch signal may be repeated. For example, the force measurement value may be cumulatively recorded until the unit condition set as the target sample number (n) is satisfied.

In detail, a predetermined reference value may be stored in the electronic device 10. For example, one reference value may be set in advance in an initial state in which no force input by the user is applied at all, and this reference value may be stored in the electronic device 10. In addition, even when a method according to an example of this disclosure is performed to set one reference value, a reference value may also be stored in the electronic device 10.

In this case, the operation S380 of setting the calculated average value as a reference value according to an example includes an operation of setting the calculated average value as a new reference value by changing a predetermined reference value when the calculated average value and the predetermined reference value are different. For example, when the previously specified or set reference value and the average value calculated according to an example of the present disclosure are different, a new reference value may be set by replacing the existing reference value.

Figure 9:
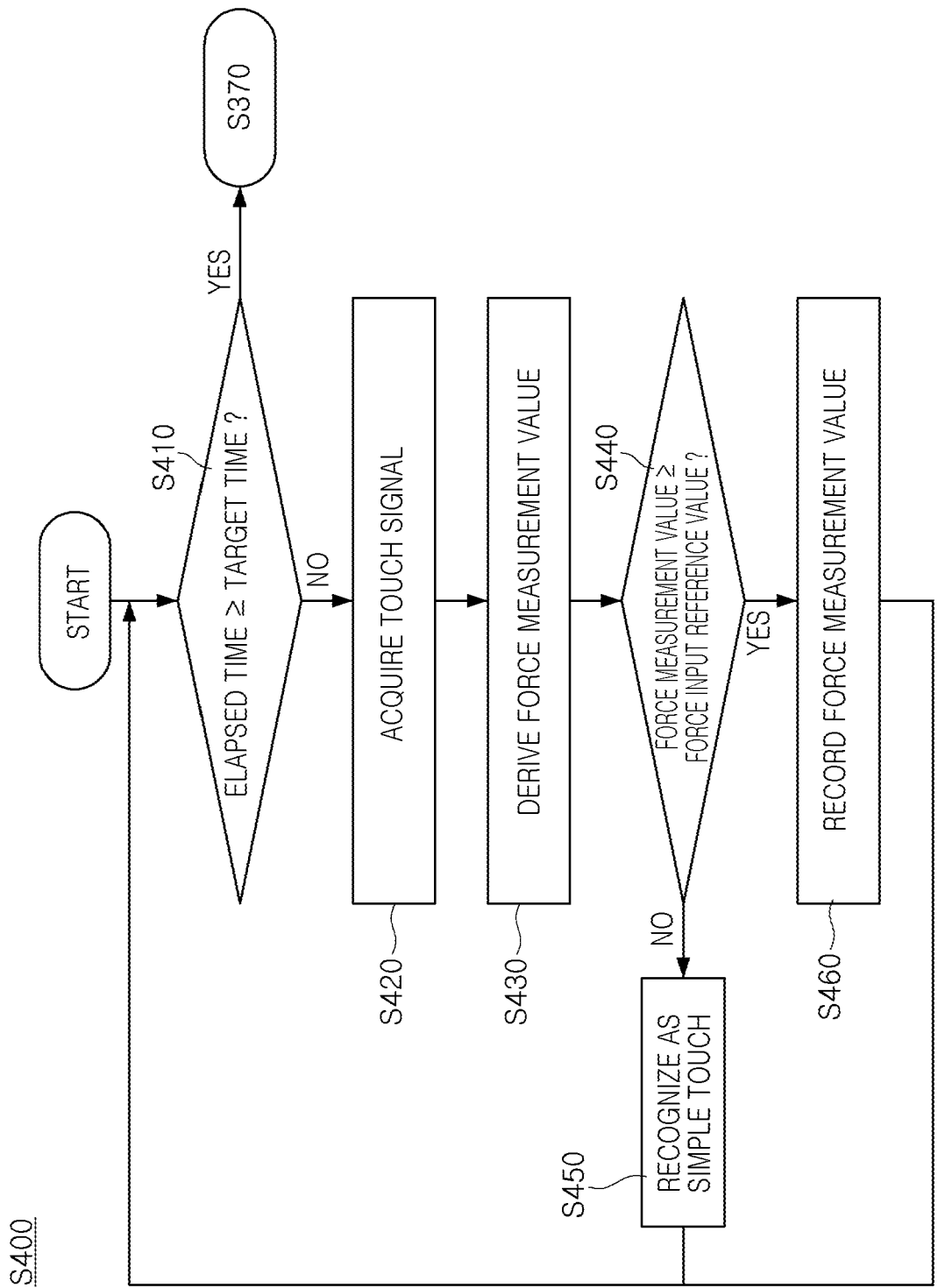
FIG. 9 is a flow chart of a method for setting a new reference value when a force measurement value is recorded until the target time is reached, according to an example.

FIG. 9 is a flowchart of a method S400 in which a new reference value is set when the force measurement value is recorded until the target time is reached, according to an example.

Referring to FIG. 9, in a method of generating an operating signal of the electronic device 10, a unit condition may be that an elapsed time reaches a target time.

As illustrated in FIG. 9, in the method S400, it may be determined every regular period whether the time elapsed so far has reached the target time, in operation S410. When it is determined, in operation S400, that the elapsed time exceeds the target time, the unit condition is considered to be satisfied, and as described above in FIG. 8, an average value of the force measurement values recorded up to the corresponding time point may be calculated in operation S370.

However, when the elapsed time does not reach the target time, the force measurement value may be continuously recorded since the unit condition is satisfied. In this case, as the touch signal is acquired in operation S420, a force measurement value is derived in operation S430. Then, in operation S440, it is determined whether the derived force measurement value is greater than or equal to the force input reference value. If, in operation S440, it is determined that the derived force measurement value is greater than or equal to the force input reference value, the force measurement value is recorded in operation S460. Alternatively, if, in operation S440, it is determined that the derived force measurement value is less than the force input reference value, an operation S450 of recognizing the touch signal as corresponding to a simple touch may be performed in the same manner as in the method of FIG. 8 described above.

Figure 10:
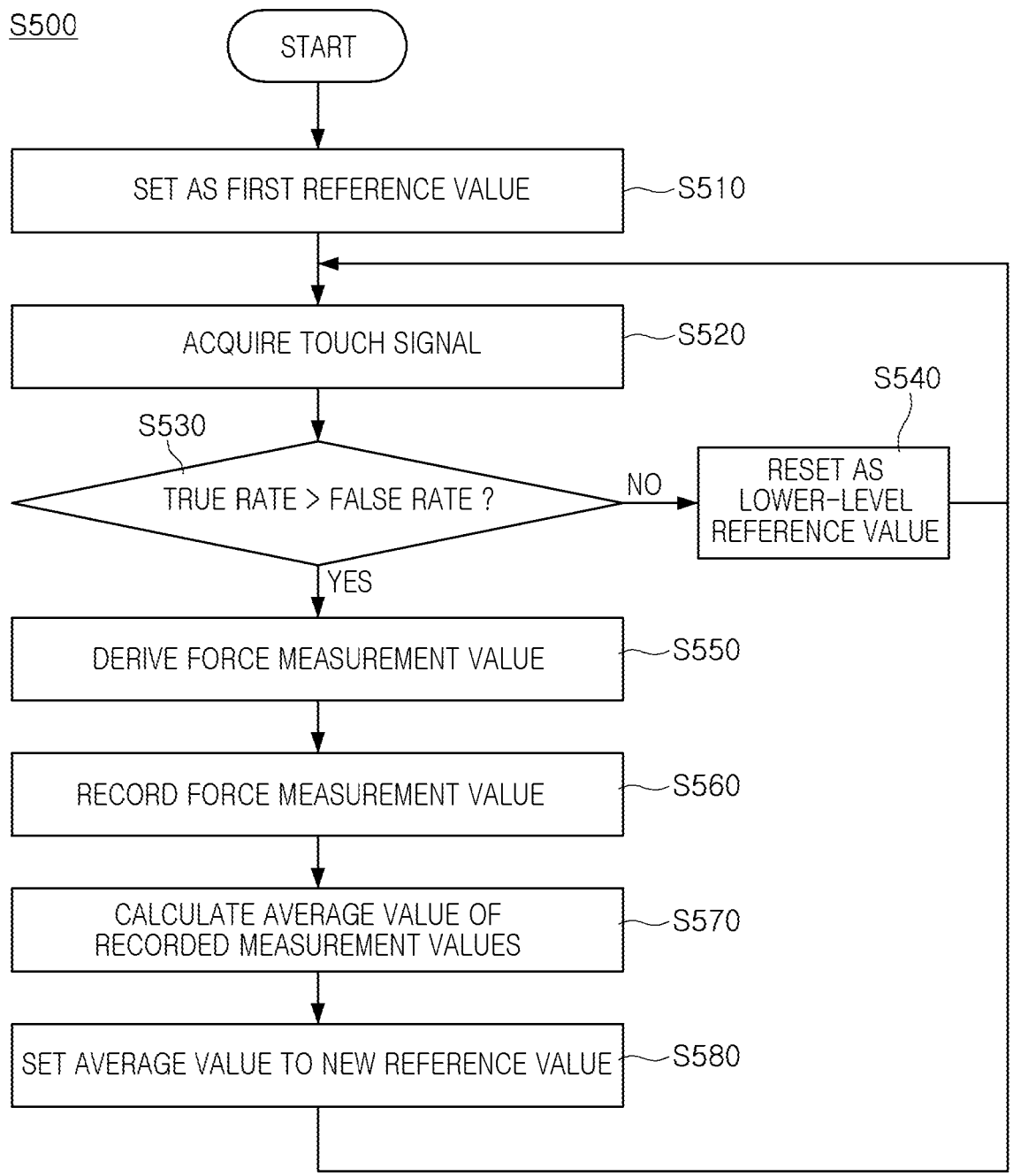
FIG. 10 is a flowchart of a method of resetting a reference value depending on a comparison result of a sensing success (True) ratio and a sensing error (False) ratio, according to an example.

FIG. 10 is a flowchart of a method S500 in which a reference value is reset depending on a comparison result of a sensing success (True) ratio and a sensing error (False) ratio, according to an example.

In the example illustrated in FIG. 10, a plurality of predetermined different reference values are stored in the electronic device 10, and the example of FIG. 10 is described based on the case in which a first reference value that is one of the plurality of predetermined reference values is set as an initial reference value in operation S510. However, this is only an example, and even when a method according to an example disclosed herein is performed such that one specific reference value is set, as well as a first reference value, this example may be equally applied.

Referring to FIG. 10, after the reference value of the electronic device 10 is set as the first reference value in operation S510, a touch signal may be obtained through the touch switching unit TSW in operation S520. In this case, it may be determined whether the rate of sensing success (True) of the force sensing performed by the touch sensing device 100 of the electronic device 10 is higher than the rate of sensing failure (false), in operation S530. The sensing success (True)/failure (False) ratio may be determined in a variety of manners, and for example, whenever a user applies a force input, the user's subsequent action is analyzed to evaluate the sensing success (True)/failure (False).

As a specific example, in the case in which the user additionally performs the operation through the electronic device 10 after applying pressure to the touch switching unit TSW, the corresponding pressing operation is likely to correspond to the force input by the user's intention. Therefore, when the corresponding pressing operation is applied, in the case in which the touch sensing device 100 according to an example detects the corresponding pressing operation as a normal force input, this case may be evaluated as a sensing success (True).

In this manner, when the success (True)/failure (False) of sensing is evaluated and accumulated, the ratio of the sensing success (True) and the sensing failure (False) may be compared. As a result of the comparison, when the sensing success (True) ratio is higher, it may be determined that the reliability of the set reference value is relatively high. Accordingly, since the reference value to be newly set does not need to be significantly changed from the first reference value, the numerical adjustment may be performed by calculating the average value of the accumulated force measurement values as described above in FIGS. 8 and 9. For example, as illustrated in FIG. 10, the force measurement value is derived in operation S550, the derived force measurement value is recorded in operation S560, the average value of the recorded measurement values is calculated in operation S570, and the average value is set as a new reference value in operation S580.

On the other hand, when the sensing failure (False) rate is higher as a result of the comparison, it may be determined that the reliability of the set reference value is relatively low. Accordingly, since the reference value to be newly set needs to be changed to a value that is significantly different from the set first reference value, the reference value to be newly set may be reset to a reference value of a lower level among predetermined differential reference values in operation S540. For example, in the case in which the sensing success (True) ratio is determined based on the first reference value, the reference value may be reset to the second reference value that is a lower level.

Figure 11:
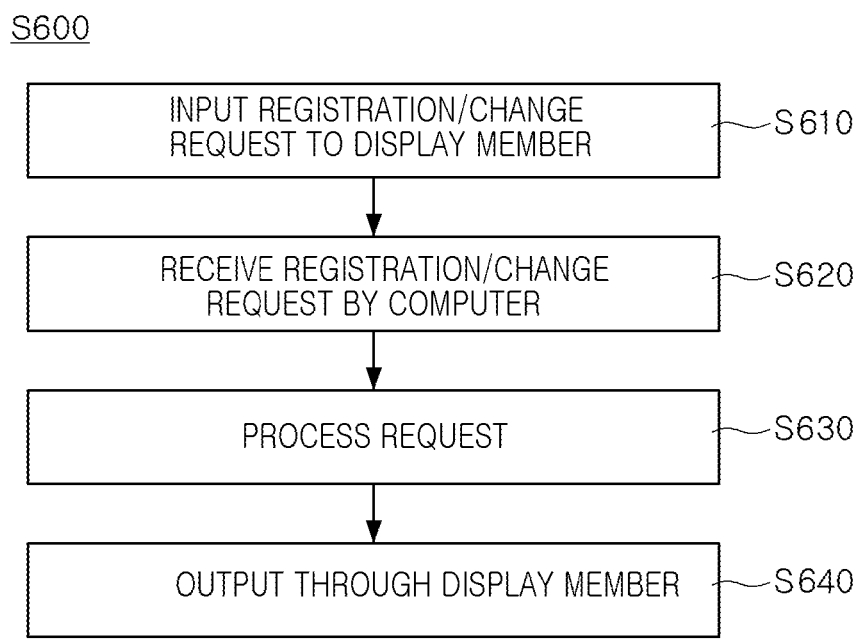
FIG. 11 is a flowchart of a method of processing a request input through a display member, according to an example.

FIG. 11 is a flowchart of a method S600 for processing a request input through the display member 500, according to an example.

As illustrated in FIG. 11, in the method 600, a user registration or change request may be input through the display member 500 in operation S610. For example, the user may input a registration request or a change request for at least one of unit conditions, user information, reference value information, and reference value group information through the display member 500. Then, the computer 400 or the computing device 1100 may receive a registration or change request based on the corresponding input in operation S620, and may process the received request according to the user request information in operation S630.

For example, when a user inputs a request for registering user information as 'female' through the display member 500, the computing device 1100 may process the information to be registered and stored in a memory or storage (e.g., the storage 1130 of the computing device 1100) capable of storing data in the electronic device 10.

Thereafter, when the request is processed by the computer 400 or the computing device 1100 in operation S630, the processing result of the request may be output through the display member 500 in operation S640.

Figure 12:
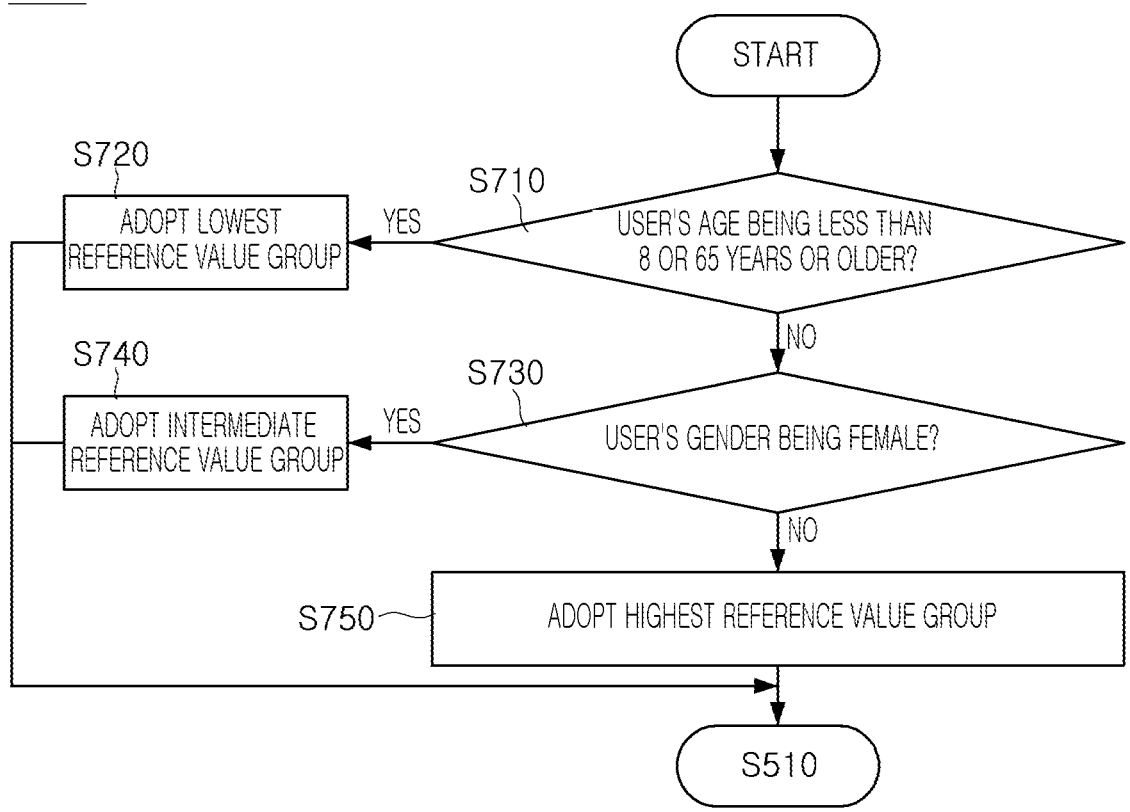
FIG. 12 is a flowchart of a method for allowing a group of reference values matching user information to be adopted, according to an example.
Figure 13:
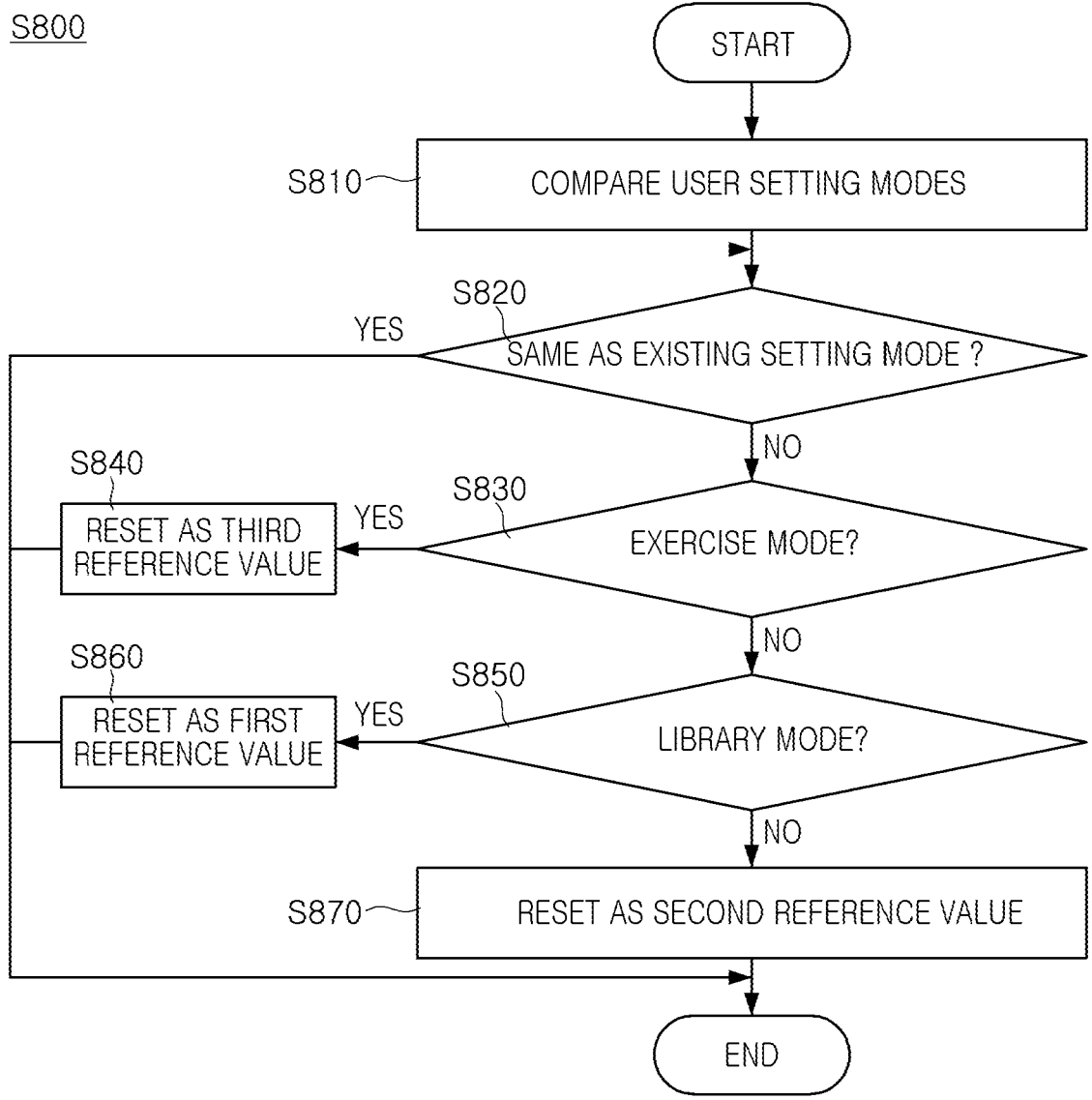
FIG. 13 is a flow chart of a method for adopting a group of reference values corresponding to a user activity state, according to an example.

FIG. 12 is a flow chart of a method S700 in which a group of reference values matching user information may be adopted. FIG. 13 is a flow chart of a method S800 in which a group of reference values matching a user activity state may be adopted.

According to an example, a plurality of predetermined reference values may be classified into a plurality of reference value groups and may be stored in the electronic device 10. In addition, one reference value group, corresponding to user information stored in advance, among the plurality of reference value groups may be adopted first. Thereafter, a first reference value, which is one of the plurality of reference values included in the adopted reference value group, may be set as an initial reference value, and a series of processes from operation S510 illustrated in FIG. 10 described above may be performed.

In this case, the reference value group refers to a group in which a plurality of reference values such as a first reference value, a second reference value, and a third reference value are grouped to be classified into categories. For example, three reference value groups each having three reference values may be pre-designated and stored in one electronic device 10. In this case, one reference value group among the three reference value groups may be adopted by user selection, and the reference value that is set among the first to third reference values included in the adopted reference value group may be determined based on the examples described above with reference to FIGS. 7 to 10.

In more detail, the operation of adopting one reference value group matching the pre-stored user information among the plurality of reference value groups may include adopting a reference value group matching information on at least one of the pre-stored user's age and gender.

Referring to FIG. 12, for example, three reference value groups may be previously stored in the electronic device 10 depending on a user's age and gender. In this case, a numerical interval between a plurality of reference values included in each reference value group may be designated smaller than a numerical interval between different reference value groups. For example, reference values having values of 15, 20 and 25 are assigned to a lowest reference value group, reference values having values of 50, 55 and 60 are assigned to an intermediate reference value group, and reference values having values of 80, 85 and 90, respectively, are assigned to a highest reference value group.

As illustrated in FIG. 12, when three reference value groups are designated in consideration of the user's age and gender, the computer 400 may adopt one reference value group suitable for the user through two-step questions. In addition, the question performed by the computer 400 may be temporarily delivered to the user through the display member 500, but may also be performed in a manner of invoking user information stored in the electronic device 10.

First, the computer 400 may request information regarding whether the user's age is less than 8 or 65 years or older, in operation S710, and in the case of the computer 400 receiving information indicating that the user's age is less than 8 or 65 years or older, it may be determined that the user's grip is the weakest. Accordingly, the lowest reference value group having lowest numerical reference values (e.g., 15, 20, 25) among the plurality of reference value groups may be adopted in operation S720.

Alternatively, if, following operation S710, the computer 400 receives information indicating that the user's age is 8 years or older and less than 65 years of age, the computer 400 may request information regarding whether the user's gender is female in operation S730. In the case of the computer 400 receiving information indicating that the user's gender is female, the intermediate reference value group having intermediate numerical reference values (e.g., 50, 55, 60) among a plurality of reference value groups may be adopted in operation S740.

Alternatively, in the case of the computer 400 receiving information indicating that the user's gender is male, it may be determined that the user's grip is the strongest. Accordingly, in operation S750, the computer 400 may adopt the highest reference value group having highest numerical reference values (e.g., 80, 85, 90) among the plurality of reference value groups.

As described above, after one reference value group is adopted depending on users, one of a plurality of reference values included in the adopted reference value group may be set as a reference value of the electronic device 10. For example, the initially set reference value may correspond to the first reference value as described above in FIG. 10 (operation S510).

As another example, three reference value groups may be previously stored in the electronic device 10 depending on a user's activity state. In this case, for example, the reference value groups may correspond to an exercise mode, a library mode, and a general mode, respectively. The computer 400 may adopt one reference value group corresponding to the pre-stored user activity state. In addition, when there is a request to change a user's activity state, the computer 400 may change to a new reference value group according to the change request.

On the other hand, a plurality of reference values themselves may be differently designated depending on the user's activity state. For example, as illustrated in FIG. 13, the first reference value, the second reference value, and the third reference value may be designated and stored in the electronic device 10, and respective reference values may be differentially designated to conform to a user's setting mode.

For example, referring to FIG. 13, in the method S800, the computer 400 may compare an existing user setting mode with a current user setting mode in operation S810. When it is determined, as a result of the comparison, that the current setting mode is the same as the existing setting mode in operation S820, a new algorithm may not be performed because there is no need to change the reference value. On the other hand, in a case in which the current setting mode is not the same as the existing setting mode, it may be inquired whether the current setting mode is an exercise mode in operation S830 or a library mode in operation S850.

When the user setting mode corresponds to the exercise mode, the reference value may be reset to a third reference value having a highest value among the three stored reference values, in operation S840. Accordingly, unintentional pressures that the user may exert while exercising may be filtered, and the sensing sensitivity of the touch sensing device 100 may be improved.

In addition, when the user setting mode corresponds to the library mode, the reference value may be reset to a first reference value having a lowest value among the three stored reference values, in operation S860. Accordingly, in a calm environment in which there is not much movement of the user, an operating signal according to the force input may be generated only by applying a weak pressure by the user.

In addition, when the user setting mode does not correspond to the exercise mode and the library mode, the reference value may be reset to a second reference value having an intermediate value in view of a general activity state, in operation S870.

Figure 14:
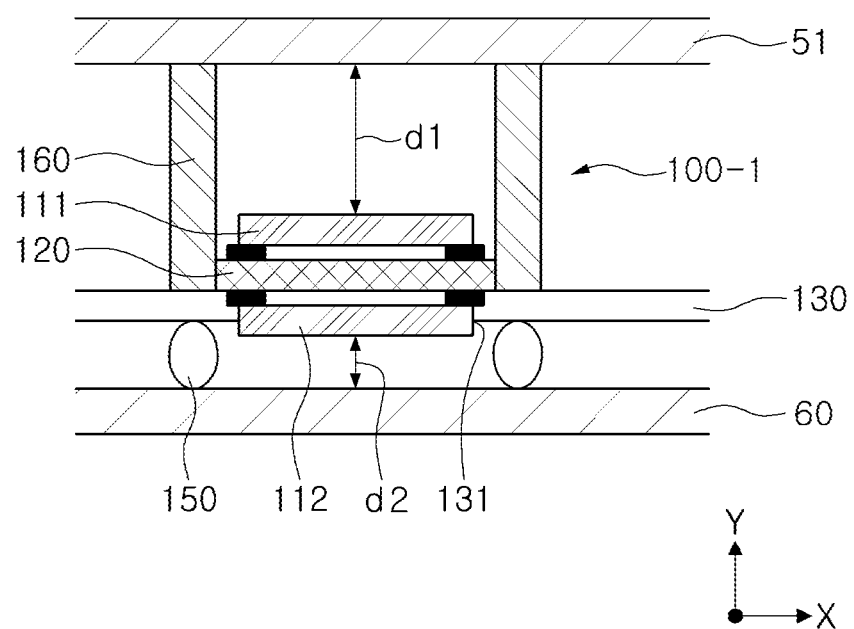
FIG. 14 is a drawing of an electronic device having a plurality of sensing coils and elastic members, according to an example.

FIG. 14 is a view illustrating an electronic device 10-1 including first and second of sensing coils 111 and 112, and elastic members 150, according to an example.

Referring to FIG. 14, the electronic device 10-1, according to an example, may include elastic members 150. In addition, a lower frame 60 may be provided below the elastic members 150. The elastic members 150 may be disposed to be compressed when the external pressure is applied to the housing 51 such that the substrate 120 descends.

Also, referring to FIG. 14, the electronic device 10-1 may include a touch sensing device 100-1 including the first sensing coil 111 and the second sensing coil 112 disposed to face a direction opposite to the direction faced by the first sensing coil 111. The substrate 120 may be disposed between the first sensing coil 111 and the second sensing coil 112 as illustrated in FIG. 14.

As illustrated in FIG. 14, the housing 51 may be spaced apart from the first sensing coil 111 by a distance d1, and the lower frame 60 disposed on the other side of the housing 51 may be spaced apart from the second sensing coil 112 by a distance d2. In this case, the lower frame 60 may be formed of the same material as the housing 51, or may be formed of a material different from the material of the housing. For example, the lower frame 60 may be formed of a metal material.

The elastic members 150 may be provided in a lowermost portion of the touch sensing device 100-1, and thus, may be disposed to be joined to the lower frame 60. When the external pressure is applied to the housing 51, the elastic members 150 may be compressed to decrease the length in the vertical direction.

The elastic members 150 may be formed of various materials that may be compressed by pressure. Referring to FIG. 14, since the support 130 and the housing 51 are connected through the support connection portions 160, when pressure is applied to the housing 51, the pressure may be transferred to the elastic members 150 located below the support 130. Therefore, for example, the elastic members 150 may be provided as one pair, and may be located on the same straight lines as the central axes of the support connecting portions 160, respectively.

By providing the elastic members 150 on a lower portion of the support 130, the elastic members 150 may be compressed to increase the degree of bending of the housing 51. Then, the distance d1 between the housing 51 and the first sensing coil 111 may be reduced at a higher rate than when the elastic members 150 are not provided.

In addition, as the elastic members 150 are compressed, the structure including the first sensing coil 111, the second sensing coil 112, the substrate 120, and the support 130 is lowered together, thereby reducing the distance d2 between the second sensing coil 112 and the lower frame 60.

As described above, by providing the elastic members 150 in the touch sensing device 100-1, the amount of change in inductance generated in the first sensing coil 111 increases, and at the same time, a change in inductance may also occur in the second sensing coil 112. For example, as the pressure is applied to the housing 51, since the change inductance increased simultaneously in the first sensing coil 111 and the second sensing coil 112 is sensed, the sensitivity of the touch sensing device 100-1 may be improved.

When the structure of the electronic device 10-1 illustrated in FIG. 14 is used, a method of generating an operating signal of the electronic device 10-1 may be performed more effectively.

In detail, as illustrated in FIG. 14, the structure in which the elastic members 150 and the first and second sensing coils 111 and 112 are added may maximize the amount of change of the inductance in preparation for the pressure applied by the user. Then, the numerical interval between a plurality of reference values may be specified to be wider in preparation for the same space. For example, the reference values may be further subdivided and designated depending on characteristics such as the user's age, gender, and activity status, and accordingly, it is easy to set user-definable reference values.

As set forth above, a method of generating an operating signal of an electronic device may allow an electronic device user to set an optimal touch sensing reference value.

In addition, in a method of generating an operating signal of an electronic device, a touch sensing reference value reflecting at least a portion of various information about a user, such as gender, age, activity state and the like, may be applied. Accordingly, a user-specific reference value for the electronic device may be set, and may be flexibly changed depending on use environments.

In addition, a method of generating an operating signal of an electronic device may reduce a malfunction that frequently occurs when detecting an input operation by a touch sensor.

The sensing circuit unit 200, the computer 400, the processor 1110, the memory 1120, and the storage 1130 in FIGS. 1 to 14 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1 to 14 that perform the operations described in this application are performed by computing hardware, for example, by one or more processors or computers, implemented as described above executing instructions or software to perform the operations described in this application are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of generating an operating signal of an electronic device, comprising:
    deriving a force measurement value based on a change in inductance of a touch sensing device disposed inside a housing of the electronic device and configured to change inductance by external pressure applied to a touch switching unit of the housing;
    accumulatively recording the force measurement value derived in the deriving of the force measurement value;
    setting a reference value based on the recorded force measurement value, in response to the force measurement value being accumulatively recorded until a unit condition is satisfied; and
    generating an operating signal based on a high and low relationship between the force measurement value derived from the change in inductance occurring after the setting of the reference value, and the set reference value,
    wherein the touch sensor comprises at least one sensing coil, comprising
        a first sensing coil; and
        a second sensing coil disposed to face a direction opposite to a direction faced by the first sensing coil, and
    wherein a substrate is disposed between the first sensing coil and the second sensing coil.

2. The method of claim 1, wherein the touch sensing device further comprises:

a sensing circuit unit electrically connected to the at least one sensing coil and configured to detect an applied force input based on a change in inductance of the at least one sensing coil.

3. The method of claim 2, wherein the at least one sensing coil comprises a plurality of sensing coils, and
wherein the touch sensing device respectively sets the reference value based on a change in inductance occurring in the plurality of sensing coils.

4. The method of claim 1, wherein the accumulatively recording of the derived force measurement value comprises recording the derived force measurement value only when the derived force measurement value is equal to or greater than a preset force input reference value.

5. The method of claim 1, wherein the unit condition is satisfied when a number of samples of the recorded force measurement value is equal to or greater than a preset target sample number.

6. The method of claim 5, wherein the number of samples of the recorded force measurement value increases by 1 only in response to the derived force measurement value being greater than or equal to a preset force input reference value.

7. The method of claim 1, the unit condition is satisfied when a measured elapsed time reaches a preset target time.

8. The method of claim 1, wherein the setting of the reference value based on the recorded force measurement value comprises:
calculating an average value of the recorded force measurement value; and
setting the calculated average value as the reference value.

9. The method of claim 8, wherein a predetermined reference value is stored in the electronic device, and
the setting of the calculated average value as the reference value comprises setting the calculated average value as a new reference value, in response to the calculated average value being different from the predetermined reference value.

10. The method of claim 1, wherein a plurality of different predetermined reference values are stored in the electronic device, and
wherein the method further comprises:
setting a first reference value, among the plurality of different predetermined reference values, as an initial reference value; and
as a result of sensing based on the first reference value, resetting a second reference value, among the plurality of predetermined reference values, as a new reference value, in response to a sensing success rate not being greater than a sensing error rate.

11. The method of claim 10, wherein the plurality of different predetermined reference values are classified into a plurality of reference value groups and stored, and
wherein the setting of the first reference value as the initial reference value comprises:
adopting one reference value group matching pre-stored user information among the plurality of reference value groups; and
setting one of a plurality of reference values included in the adopted one reference value group as the first reference value.

12. The method of claim 11, wherein the adopting of the one reference value group matching pre-stored user information among the plurality of reference value groups comprises adopting one reference value group corresponding to information regarding at least one of a pre-stored user age and a pre-stored user gender.

13. The method of claim 11, wherein the adopting of the one reference value group matching pre-stored user information among the plurality of reference value groups comprises:
adopting one reference value group corresponding to a pre-stored user activity state; and
in response to a request to change the pre-stored user activity state, adopting a new reference value group according to the request to change.

14. A non-transitory computer-readable storage medium storing instructions that, when executed by a processor, cause the processor to perform the method of claim 1.

15. An electronic device, comprising:
a housing including a touch switching unit;
a substrate disposed inside the housing;
at least one sensing coil disposed on the substrate and configured to exhibit a change in inductance in response to an external pressure applied to the touch switching unit; and
a computer configured to:
derive a force measurement value based on the change in inductance;
accumulatively record the derived force measurement value;
set a reference value based on the recorded force measurement value, in response to the derived force measurement value being accumulatively recorded until a unit condition is satisfied; and
generate an operating signal based on a high and low relationship between the force measurement value derived from a change in inductance that occurs after setting the reference value, and the set reference value,
wherein the at least one sensing coil comprises
a first sensing coil; and
a second sensing coil disposed to face a direction opposite to a direction faced by the first sensing coil, and
wherein the substrate is disposed between the first sensing coil and the second sensing coil.

16. The electronic device of claim 15, wherein, in the housing, the touch switching unit, and at least a portion other than the touch switching unit are flat with respect to each other.

17. The electronic device of claim 15, further comprising a display member configured to display information based on the operating signal,
wherein the touch switching unit is disposed not to overlap with an output direction of display information of the display member.

18. The electronic device of claim 17, wherein the computer is further configured to:
receive and process a registration request or a change request for any one or any combination of any two or more of the unit condition, user information, reference value information, and reference value group information, in response to the registration request or the change request being input through the display member; and
enable a result of the processing of the registration request or the change request to be output through the display member.

19. The electronic device of claim 15, wherein a plurality of different predetermined reference values are stored in the electronic device, and
wherein the computer is further configured to:

set a first reference value, among the plurality of predetermined reference values, to an initial reference value; and reset a second reference value, among the plurality of predetermined reference values, to a new reference value, in response to a sensing success ratio not being greater than a sensing error ratio in a sensing result based on the first reference value.

20. The electronic device of claim 19, further comprising an elastic member configured to be compressed as external pressure is applied to the touch switching unit, to enable the substrate to descend.

21. An electronic device, comprising:
a housing;
a substrate disposed inside the housing;
a touch sensing device including at least one sensing coil, and configured to exhibit changes in inductance in response to external pressures applied to the housing; and
a processor configured to:
generate force measurement values corresponding to the changes in inductance;
generate operating signals based on comparisons between the generated force measurement values and a stored reference value;
accumulatively record the generated force measurement values; and
update the stored reference value based on the accumulatively recorded generated force measurement values, in response to a preset condition being satisfied,
wherein the at least one sensing coil comprises
a first sensing coil; and
a second sensing coil disposed to face a direction opposite to a direction faced by the first sensing coil, and
wherein the substrate is disposed between the first sensing coil and the second sensing coil.

22. The electronic device of claim 21, wherein the preset condition is satisfied when the accumulatively recording is performed a predetermined number of times, or when a measured elapsed time reaches a preset target time.

23. The electronic device of claim 21, wherein the updating of the stored reference value comprises replacing the stored reference value with an average value of the accumulatively recorded generated force measurement values.

24. The electronic device of claim 21, wherein the stored reference value is preset based on any one or any combination of any two or more of an input age of a user of the electronic device, an input gender of the user, and an input activity level of the user.

* * * * *